US007153704B2

(12) United States Patent
Inomata

(10) Patent No.: US 7,153,704 B2
(45) Date of Patent: Dec. 26, 2006

(54) METHOD OF FABRICATING A FERROELECTRIC CAPACITOR HAVING A FERROELECTRIC FILM AND A PARAELECTRIC FILM

(75) Inventor: Daisuke Inomata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 166 days.

(21) Appl. No.: 10/739,035

(22) Filed: Dec. 19, 2003

(65) Prior Publication Data

US 2004/0266031 A1  Dec. 30, 2004

(30) Foreign Application Priority Data

Jun. 30, 2003  (JP)  ............................. 2003-188216

(51) Int. Cl.
H01L 21/00  (2006.01)
H01L 21/8242  (2006.01)
(52) U.S. Cl. ........................... 438/3; 438/240; 438/396
(58) Field of Classification Search .................. 438/3, 438/240, 396
See application file for complete search history.

(56) References Cited

U.S. PATENT DOCUMENTS 6,115,281 A * 9/2000 Aggarwal et al. .......... 365/145
6,121,648 A * 9/2000 Evans, Jr. .................... 257/295
6,342,337 B1 * 1/2002 Yamanobe .................. 430/314
6,414,344 B1 * 7/2002 Kweon ........................ 257/295
6,521,927 B1 * 2/2003 Hidaka et al. .............. 257/295
6,538,272 B1 * 3/2003 Yamazaki et al. .......... 257/295
6,699,726 B1 * 3/2004 Hidaka et al. ................. 438/3

FOREIGN PATENT DOCUMENTS

JP        5-63203        3/1993

* cited by examiner

Primary Examiner—Evan Pert
(74) Attorney, Agent, or Firm—Volentine Francos & Whitt, PLLC

(57) ABSTRACT

A method of fabricating a ferroelectric capacitor that can inhibit ferroelectric characteristics from deteriorating includes forming a lower electrode film over from on a top surface of a plug disposed in a silicon oxide film to on the silicon oxide film; forming a paraelectric film so as to frame-likely cover a periphery of a surface of the lower electrode film with a predetermined width; forming a ferroelectric film over from on the exposed lower electrode film from an opening of the paraelectric film to on the paraelectric film in the surroundings of the exposed lower electrode film; forming an upper electrode film, in a surface of the ferroelectric film, over from on a region that faces a contact surface between the lower electrode film and the ferroelectric film to on a region that faces the paraelectric film; and etching through a mask that covers, in a surface of the upper electrode film, from a region that faces the contact surface to a region that faces the paraelectric film.

20 Claims, 11 Drawing Sheets

METHOD OF FABRICATING A FERROELECTRIC CAPACITOR HAVING A FERROELECTRIC FILM AND A PARAELECTRIC FILM

BACKGROUND OF THE INVENTION

1. Field of the Invention

The present invention relates to a ferroelectric capacitor, a semiconductor device equipped with the ferroelectric capacitor and fabricating methods thereof.

2. Description of the Related Art

A ferroelectric memory that uses a ferroelectric capacitor, in view of capability of rapid data recording and random accessing, is expected as a novel nonvolatile memory.

A ferroelectric memory is a memory that has a cell structure that includes a ferroelectric capacitor including a ferroelectric film and a transistor and utilizes reversal of an electric field due to spontaneous polarization of the ferroelectric film that stores and memorizes electric charges and retention function thereof (Patent Document Nos. 1 and 2.).

As the cell structure of the ferroelectric memory, there are mainly two types, namely, a planar type and a stack type.

In the planar type, a lower electrode film of a ferroelectric capacitor simultaneously plays the role of a plate line, and an upper electrode film is electrically connected to a diffusion layer of a transistor disposed side by side with the ferroelectric capacitor.

On the other hand, the stack type has a cell structure in which, above the transistor, a ferroelectric capacitor is stacked. That is, an upper electrode film of the ferroelectric capacitor combines with a plate line or is electrically connected to a plate line, and a lower electrode is electrically connected through a metal plug to a diffusion layer of a transistor disposed below the lower electrode. Accordingly, the stack type can reduce a cell area than the planar type and can be applied to a more miniature design rule.

[Patent Document No. 1]
JP-A No. 5-63203
[Patent Document No. 2]
JP-A No. 2002-289802

However, there are difficulties putting a stack type ferroelectric memory having a fine design rule into practical use, because of occurrence of various problems described below.

The stack type ferroelectric memory, as mentioned above, has a structure in which a ferroelectric capacitor is formed to a metal plug.

However, ordinarily, in the case of a ferroelectric film being deposited, in order to crystallize the ferroelectric film, high temperature heating in an oxygen atmosphere has to be performed.

Accordingly, when a film for forming a ferroelectric film is deposited, to an insulating layer formed below a lower electrode film, oxygen is diffused. As a result, a plug buried in the insulating layer is oxidized, and, in some cases, the continuity between the lower electrode film and a diffusion region cannot be attained (problem (1)).

In this connection, a method is proposed in which in depositing a ferroelectric film, a crystallizing temperature is set at a temperature the same or less than an oxidizing temperature of the plug material. However, in this case, the crystallization of the ferroelectric film becomes insufficient, resulting in a decrease in the reliability of the ferroelectric capacitor.

In this connection, as a method of inhibiting the plug from being oxidized, a method is proposed in which in processing a stack type ferroelectric capacitor, after a lower electrode film, a ferroelectric film and an upper electrode film are sequentially deposited on a plug, these films are collectively etched.

In this case, high temperature heating can be applied in a state where a lower electrode film that is oxidation resistant is not processed; accordingly, the oxidation resistance of a plug becomes very high.

However, on an end face of the ferroelectric film processed by the etching, in some cases, a damaged area is formed. The damaged region is a degenerated region that includes crystal structure irregularity and compositional change formed during the etching by a reaction between a ferroelectric material on an etching surface and a reaction gas, or an intermediate reaction product formed by a reaction between the upper electrode and lower electrode materials and a reaction gas.

As a result, in some cases, owing to the occurrence of such damaged region, a normal operation of the ferroelectric capacitor is disturbed, and the reliability of the ferroelectric capacitor cannot be secured (problem (2)).

Accordingly, the object of the invention is to solve the above problems (1) and (2) and thereby to provide a ferroelectric capacitor that can secure high reliability, a semiconductor device equipped with the ferroelectric capacitor and methods of fabricating these.

SUMMARY OF THE INVENTION

A fabricating method of a ferroelectric capacitor according to the invention has the following constitutional characteristics.

That is, the method of fabricating the ferroelectric capacitor includes forming a lower electrode film, forming a paraelectric film, forming a ferroelectric film, forming an upper electrode film and etching.

In the forming of a lower electrode film, on a top surface of a conductive portion formed in a through hole disposed in an insulating layer and on an insulating layer at the surroundings of the top surface, a lower electrode film is formed. In the forming of a paraelectric film, on the lower electrode film, a paraelectric film is formed so as to partially expose a surface of the lower electrode film. In the forming of a ferroelectric film, on the exposed lower electrode film and on the paraelectric film at the surroundings of the exposed lower electrode film, a ferroelectric film is formed. In the forming of an upper electrode film, on a region that faces the lower electrode film exposed by the paraelectric film in the ferroelectric film and on a region that is at the surroundings of a region of the ferroelectric film and faces the paraelectric film, an upper electrode film is formed. For the etching, a mask on a region that faces the lower electrode film exposed by the paraelectric film in the upper electrode film and on a region that is at the surroundings of the region of the upper electrode film and faces the paraelectric film is formed. Then, thorough the mask, from a side of a surface of the upper electrode film, etching is applied to the upper electrode film, the ferroelectric film, the paraelectric film and the lower electrode film.

According to this configuration, a ferroelectric capacitor present in an effective region that effectively functions of the ferroelectric capacitor becomes a portion that includes a portion that is not covered by the paraelectric film but is exposed therefrom of the lower electrode film; a portion that faces, that is, squarely opposes through the ferroelectric film and the lower electrode film portion (the region is also called as a facing region or opposing region) of the upper electrode film; and the ferroelectric film intervened between an opposing region of the lower electrode film and the upper electrode film.

As a result, since a sidewall portion of the ferroelectric film is located outside of the effective region of the above-mentioned ferroelectric capacitor, the ferroelectric characteristics can be inhibited from deteriorating owing to the damaged region formed on a sidewall of the ferroelectric film (elimination of problem (2)).

Furthermore, according to the invention, in forming a ferroelectric film in an oxygen atmosphere, on a wide region on the semiconductor substrate, a lower electrode film high in the oxidation resistance can be left remained. As a result, in forming the ferroelectric film, a plug on a lower side of the lower electrode film can be inhibited from oxidizing (elimination of problem (1)).

Accordingly, a ferroelectric capacitor that is more than ever highly reliable can be realized.

DESCRIPTION OF THE PREFERRED EMBODIMENTS

Figure 1:
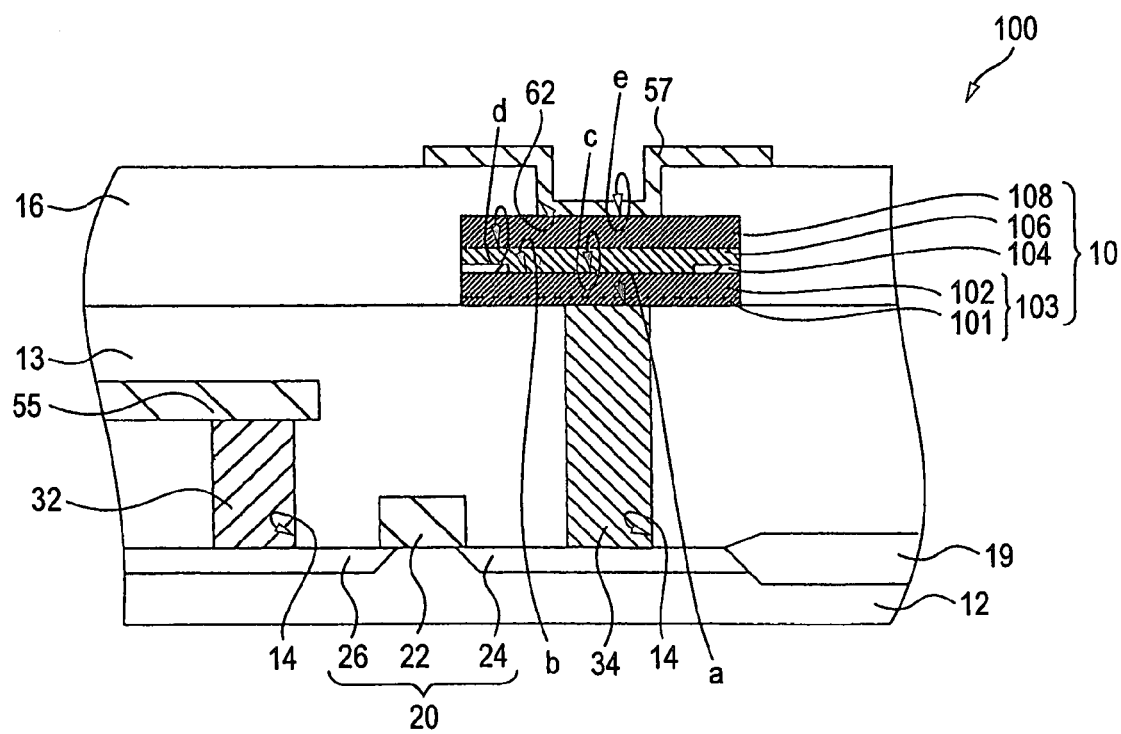
FIG. 1 is a schematic sectional view of an essential portion of a semiconductor device according to a first embodiment according to the invention.

In the following, with reference to the drawings, embodiments according to the invention will be explained. In the respective drawings, to the extent that allows understanding the invention, shapes, magnitudes and positional relations are only schematically shown; accordingly, the invention is not restricted to illustrated examples. Furthermore, in plan views, in order to clarify the layout relation of illustrated constitutional components, contour lines hidden from a visual field by an overlapped member or structure are shown with solid lines or broken lines; however, in some plan views, display of the hidden contour lines is omitted. Furthermore, for the purpose of easy understanding of the drawings, the hatchings that show a cross section are omitted with only part left. Furthermore, the explanations below are only for preferred examples and numerical conditions are by no means restricted to exemplified ones. Furthermore, similar constitutional components in the respective drawings are shown with the same reference numerals, and, in some cases, duplicated explanations are omitted.

<First Embodiment>

FIG. 1 is a schematic sectional view showing an essential potion of a semiconductor device 100 equipped with a ferroelectric capacitor 10 involving this embodiment as well as a cut surface obtained by cutting a ferroelectric memory cell (hereinafter in some cases simply referred to as "memory cell") 50 of a schematic diagram showing a layout of the semiconductor device 100 shown in FIG. 2 along an I—I line shown by a chain line, namely, a view that sees a cross section from an arrow mark direction in the drawing.

Firstly, in advance of the explanation of the semiconductor device 100 shown in FIG. 1, the semiconductor device 100 according to the embodiment will be explained with reference to FIG. 2.

As shown in a layout diagram of the semiconductor device 100 shown in FIG. 2, a memory cell 50 that is a semiconductor device 100 according to the embodiment and has a stack type structure, as one example, includes a MOS (Metal Oxide Semiconductor) type field effect transistor (hereinafter in some cases simply referred to as "transistor") 20 and a ferroelectric capacitor 10.

Figure 2:
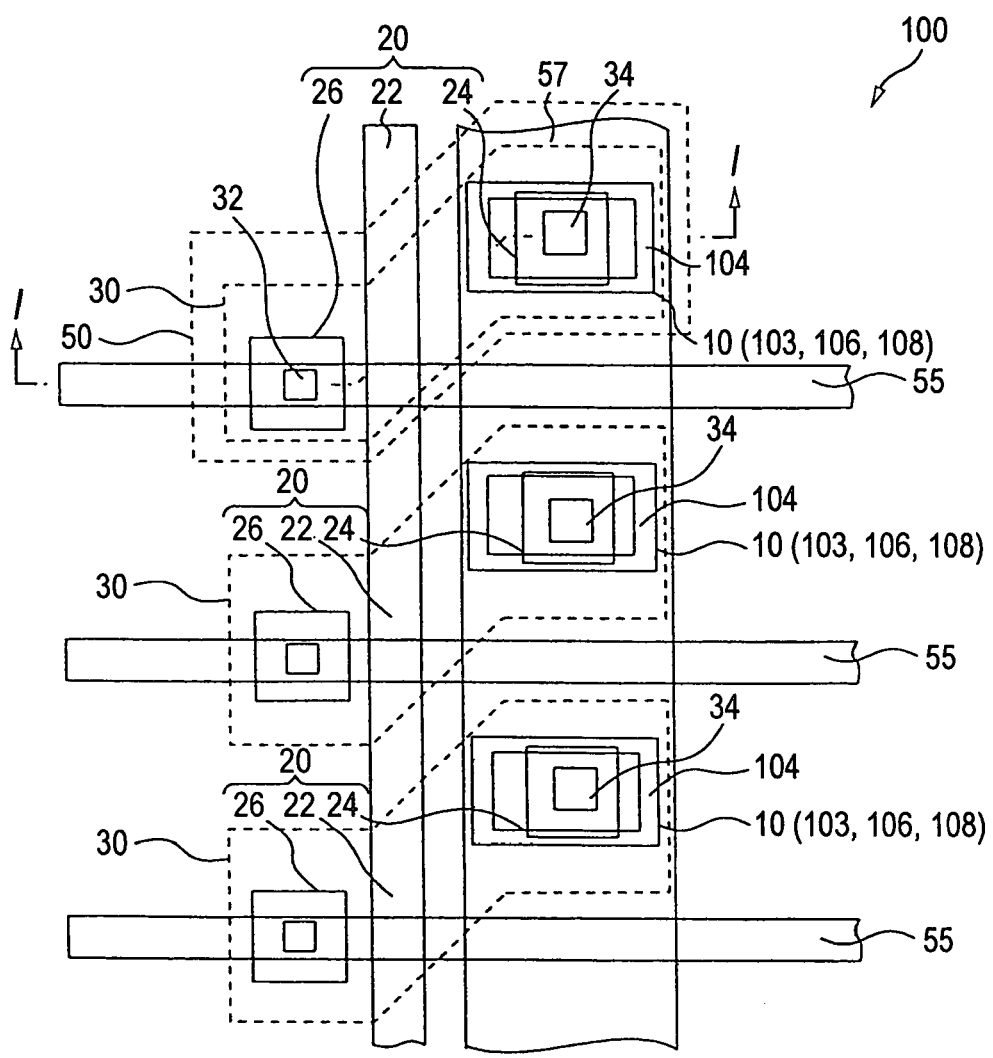
FIG. 2 is a schematic diagram showing a layout of an essential portion of a semiconductor device according to a first embodiment according to the invention.

As shown in FIG. 2, the transistor 20 includes a source electrode (alternatively called also as a "source region") 24 as a first main electrode and a drain electrode (alternatively called also as a "drain region") 26 as a second main electrode. The source electrode 24 and the drain electrode 26 are formed as a pair of impurity diffusion regions within an active region 30 at such positions that sandwich a gate electrode 22 as a control electrode that is a word line. Furthermore, the source electrode 24 is electrically connected through a plug 34 as a conductive portion that is a capacitor contact to a lower electrode film 103 that constitutes a ferroelectric capacitor 10. The drain electrode 26 is electrically connected through a bit line contact 32 to a bit line 55.

The ferroelectric capacitor 10 has a configuration in which on a lower electrode film 103, a ferroelectric film 106 and an upper electrode film 108 are sequentially stacked (details will be described later), and on the upper electrode film 108 a plate line 57 is formed. In this example of the configuration, the bit line 55 is disposed orthogonal to each of the word line 22 and the plate line 57; however, the configuration is not restricted thereto. Accordingly, in accordance with the layout of the memory cell 50, the bit line, the word line and the plate line can be disposed at arbitrarily preferable positions.

Subsequently, with reference to FIG. 1, the semiconductor device 100 according to the embodiment will be detailed.

As shown in FIG. 1, the transistor 20 includes the gate electrode 22, the source electrode 24 and the drain electrode 26. The gate electrode 22 is formed through a gate insulating film (omitted in the drawing) on the silicon substrate 12 that is a semiconductor substrate. The source electrode 24 and the drain electrode 26 are formed at positions that sandwich the gate electrode 22 in a surface region of the silicon substrate 12. The transistor 20 can be arbitrarily and preferably selected from either one of an n-channel type or a p-channel type. The transistor 20 is formed on the silicon substrate 12 and buried in a silicon oxide ($SiO_2$) film 13 as an insulating layer. A surface of the insulating film 13 is practically planarized.

The source electrode 24 is electrically connected through a plug 34 formed in the silicon oxide film 13 to the lower electrode film 103 that is described later. The plug 34 is formed by filling poly-silicon (Poly-Si) or tungsten (W) that is a conductive material in a contact hole 14 as a through hole formed in the silicon oxide film 13. Furthermore, the silicon oxide film 13 exposes an end face (alternatively also called as a "top surface") a on a side opposite to a substrate of the plug 34 and substantially forms a plane the same as an end face a of the plug 34.

Furthermore, the drain electrode 26 is electrically connected through a bit line contact 32 formed in the silicon oxide film 13 to the bit line 55 made of tungsten or tungsten silicide ($WSi_x$) embedded similarly in the insulating film 13. The bit line contact 32 is formed by filling a conductive material such as polysilicon or tungsten in a contact hole 14 formed in the silicon oxide film 13. An isolation insulating film 19 insulatively isolates adjacent transistors from each other. The structure of the transistor 20 here is so far known; accordingly, detailed explanation thereof is omitted.

Furthermore, as shown in FIG. 1, the ferroelectric capacitor 10 according to the embodiment includes the lower electrode film 103, the paraelectric film 104, the ferroelectric film 106 and the upper electrode film 108 stacked sequentially in this order from a side of the silicon substrate 12.

Specifically, as shown in FIG. 1, the lower electrode film 103 according to the embodiment is disposed on the top surface a of the plug 34 and on the silicon oxide film 13 at the surroundings of the top surface a. The lower electrode film 103 includes a barrier metal 101 that inhibits the interdiffusion of the metal with the plug 34 from occurring and a metal film 102 that is disposed on the barrier metal and excellent in the oxidation resistance. In this constitutional example, the barrier metal 101 is formed of a titanium nitride (TiN) film and the metal film is formed of an iridium (Ir) film 102. In order to improve the adhesiveness between the barrier metal 101 and the lower electrode film 103, a titanium oxide ($TiO_2$) film may be disposed therebetween as an adherence layer. Furthermore, in the case of the ferroelectric film 106 described later being formed of strontium bismuth tantalate ($SrBi_2Ta_2O_9$), in order to improve the adhesiveness with the strontium bismuth tantalite film, as the upper-most film of the lower electrode film 103, a platinum (Pt) film may be further formed. The paraelectric film 104 is disposed on the lower electrode film 103 so as to expose part c of a surface b of the lower electrode film 103. The paraelectric film 104 in this constitutional example is disposed so as to frame-likely cover a periphery of the surface b of the lower electrode film 103 with a predetermined width and made of a silicon oxide film (relative permittivity: substantially from 3.9 to 4.9). The paraelectric film 104 plays not only the role of a spacer between the lower electrode film 103 and the upper electrode film 108 described later but also the role of endowing paraelectric capacitance (that is, capacitance) (detailed explanation is described below). The paraelectric film 104 is not restricted to a silicon oxide film; a paraelectric film having the relative permittivity small enough in comparison with the relative permittivity (100 or more) of the ferroelectric film 106 described later can be used; that is, a paraelectric film having the relative permittivity of less than 10 such as a silicon nitride (SiN) film (relative permittivity: substantially from 6 to 9) is preferably used. The ferroelectric film 106, formed of a strontium bismuth tantalite film, is disposed on the lower electrode film 103 exposed by the silicon oxide film 104 and on the silicon oxide film 104 at the surroundings of the exposed lower electrode film 103. The upper electrode film 108, made of platinum, is disposed, on a surface d of the ferroelectric film 106, on a region facing a contact surface c between the lower electrode film 103 and the ferroelectric film 106 and on a region at the surroundings of the region of the ferroelectric film 106 and faces the paraelectric film 104. Furthermore, a sidewall surface of the ferroelectric capacitor 10 that is constituted of the respective end faces of these lower electrode film 103, paraelectric film 104, ferroelectric film 106 and the upper electrode film 108 is formed into a substantially non-irregular surface.

Furthermore, as shown in FIG. 1, the ferroelectric capacitor 10 is embedded in a silicon oxide film 16 that is an insulating film so as to partially expose a surface e of the upper electrode film 108 from a contact hole 62. On the exposed upper electrode film 108, a plate line 57 made of platinum is disposed.

Subsequently, with reference to FIGS. 3A through 5B, a method of fabricating the semiconductor device 100 will be explained.

Figure 3A:
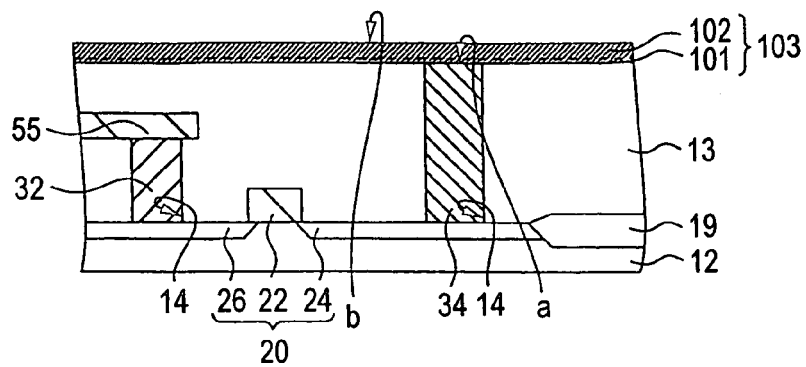
FIGS. 3A through 3C are fabrication process diagrams (part 1) of a semiconductor device according to a first embodiment according to the invention.

Firstly, as shown in FIG. 3A, as a step of forming a transistor, on a silicon substrate 12, by use of an arbitrary and preferable method, an isolation insulating film 19 for insulating and isolating adjacent transistors from each other is disposed. In a region of the silicon substrate 12 surrounded by the isolation insulating film 19, a transistor 20 is formed. In the formation of the transistor 20, by use of an arbitrary and preferable method, in the silicon substrate 12, at positions that sandwich a formation position of a gate electrode 22, in contact with a surface of the silicon substrate, a source electrode 24 and a drain electrode 26 that are a pair of impurity diffusion layers are formed. Thereafter, at a position between the source electrode 24 and the drain electrode 26 on the silicon substrate 12, a gate electrode 22 is formed. Furthermore, by use of an arbitrary and preferable method, a bit line contact 32 is formed on the drain electrode 26; thereafter, a bit line 55 electrically connected to the bit line contact 32 is formed by patterning line-likely.

Subsequently, as a step of forming an insulating layer, on the silicon substrate 12, an insulating film is deposited so as to cover the transistor 20, bit line contact 32 and bit line 55. Here, with a silicon oxide film 13 as the insulating film, a chemical vapor deposition method (CVD) is used. Thereafter, a surface of the silicon oxide film 13 is planarized by use of a chemical mechanical polishing (CMP) method to a film thickness of 1200 nm.

Still subsequently, as a step of forming a conductive portion, photolithography and etching are sequentially applied to the silicon oxide film 13 to open a contact hole 14 that reaches the source electrode 24. Thereafter, tungsten is buried in the contact hole 14 by means of a CVD method followed by applying CMP to the tungsten so as to be practically the same surface level as a surface of the silicon oxide film 13, and thereby a plug 34 as a conductive portion having a top surface a is formed.

Subsequently, as a step of forming a lower electrode film, on the top surface a of the plug 34 and on the silicon oxide film 13 at the surroundings of the top surface a, a lower electrode film 103 is formed.

That is, firstly, on the top surface a of the plug 34 and on the silicon oxide film 13 at the surroundings of the top surface a, a barrier metal 101 such as titanium nitride is formed. The barrier metal 101 is formed in such a way that firstly titanium (Ti) having a film thickness of 15 nm is formed by means of the sputtering method then followed by applying rapid thermal anneal (RTA) at 750 degree centigrade for 30 s in an atmosphere of nitrogen ($N_2$). Thereafter, on the barrier metal 101, an iridium film 102 is formed into a film thickness of 100 nm by use of a direct current sputtering method. Thus, a lower electrode film 103 including the barrier metal 101 and the iridium film 102 is formed.

Subsequently, as a step of forming a paraelectric film, on the lower electrode film 103, a paraelectric film 104 is formed so that a surface of the lower electrode film is partially exposed.

Figure 3B:
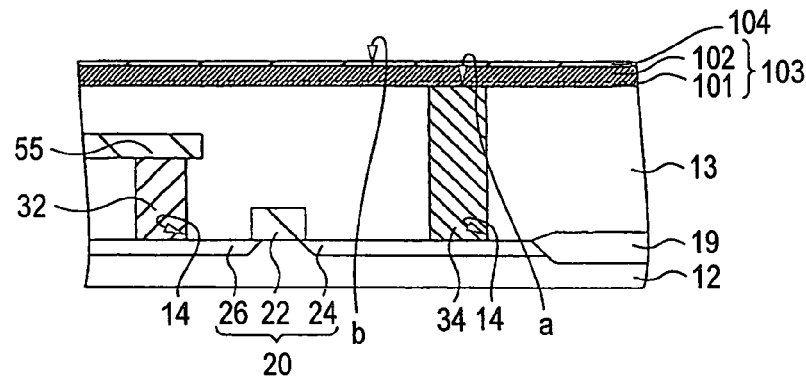
Figure 3C:
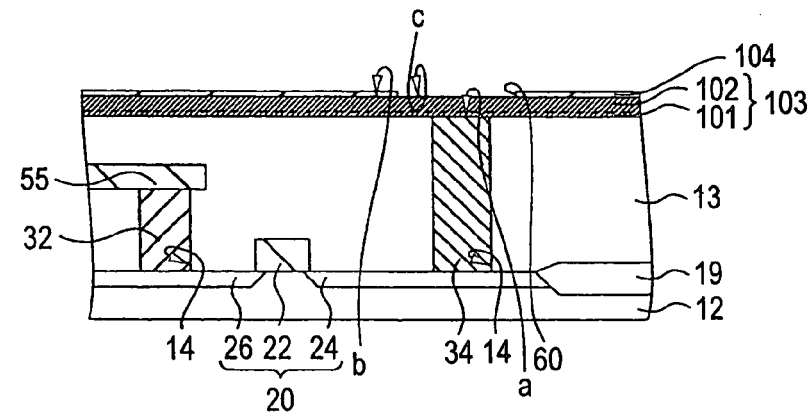

That is, as shown in FIG. 3B, firstly, on a surface b of the lower electrode film 103, as a paraelectric film, according to a plasma CVD method that uses ozone ($O_3$)-TEOS (tetraethyl orthosilicate), a silicon oxide film (also called as $O_3$-TEOS oxide film) 104 is formed with a film thickness of 10 nm. As a paraelectric film material here, a TEOS base paraelectric film that is less in the detachment of water ($H_2O$) and hydrogen ($H_2$) in the heating during the step of forming the ferroelectric film is more preferable than a silane base paraelectric film. Thereafter, to the silicon oxide film 104, the photolithography and the etching are sequentially applied to form an opening 60, and thereby a silicon oxide film 104 that frame-likely covers a periphery of the surface b of the lower electrode film 103 with a predetermined width is formed (FIG. 3C). At this time, a dimension (X-direction and Y-direction) of a surface c of the lower electrode film 103 exposed from the opening 60 of the silicon oxide film 104 is designed, based on an operation specification of the ferroelectric capacitor and so on, so as to be a dimension of an effective region (described later) that is wanted to practically function as the ferroelectric capacitor.

Subsequently, as a step of forming a ferroelectric film, on the exposed lower electrode film 103 and on the paraelectric film 104 at the surroundings of the exposed lower electrode film 103, a ferroelectric film 106 is formed.

Figure 4A:
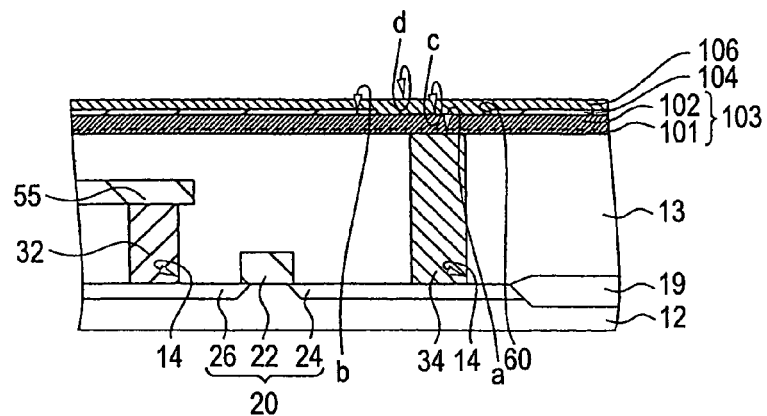
FIGS. 4A through 4C are fabrication process diagrams (part 2), subsequent to FIGS. 3A through 3C, of a semiconductor device of a first embodiment according to the invention.

That is, firstly, on the exposed lower electrode film 103 and on the silicon oxide film 104 at the surroundings of the exposed lower electrode film 103, a precursor solution of strontium bismuth tantalite is coated by use of a spin coat method. This coating solution is dried at a temperature in the range of from 150 to 260 degree centigrade followed by applying the RTA at 700 degree centigrade for 1 min in an oxygen atmosphere, and thereby a strontium bismuth tantalite film is formed. Thereafter, in the constitutional example, the coating process and the RTA process are similarly repeated two times further followed by applying the RTA at 700 degree centigrade for 1 hr in an oxygen atmosphere. Thus, a strontium bismuth tantalite film 106 as a ferroelectric film is formed with a final film thickness of 100 nm (FIG. 4A).

Figure 4B:
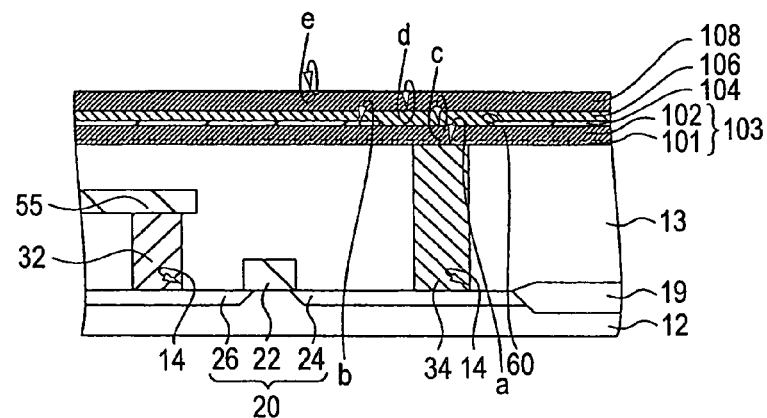

In the next place, as a step of forming an upper electrode film, on a surface d of the ferroelectric film 106, on a region that faces a contact surface c between the lower electrode film 103 and the ferroelectric film 106 and on a region that is at the surroundings of the region and faces the paraelectric film 104, by use of the sputtering method, a platinum film having a film thickness of 100 nm is formed as the upper electrode film 108 (FIG. 4B).

Figure 4C:
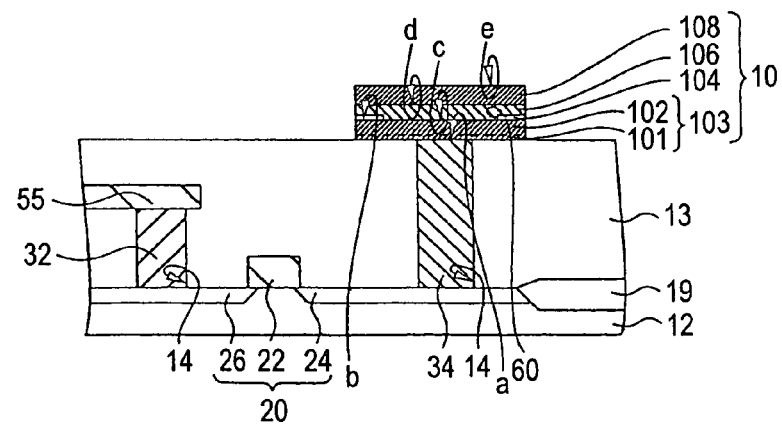

Subsequently, as a step of etching, firstly, at a surface e of the upper electrode film 108 (FIG. 4B), a mask (not shown in the drawing) that is on a region that faces a contact surface c between the lower electrode film 103 and the ferroelectric film 106 and on a region that is at the surroundings of the region and faces the paraelectric film 104 is formed. Thereafter, through the mask, the etching is collectively applied, from a surface side of the upper electrode film 108, to the upper electrode film 108, the ferroelectric film 106, the paraelectric film 104 and the lower electrode film 103. Specifically, so that the frame-like paraelectric film 104 may remain with a predetermined width, the etching is performed to the upper electrode film 108, the ferroelectric film 106, the paraelectric film 104 and the lower electrode film 103, and thereby a ferroelectric capacitor 10 with a predetermined shape that is separated individually for each bit is formed (FIG. 4C). A dimension of the capacitor here is set based on the dimension of the effective region as the aforementioned ferroelectric capacitor and the width of the frame-like paraelectric film to be left. Furthermore, a width of the paraelectric film 104 after the etching can be arbitrarily set in conformity with the design standard and so on due to the design rule and the process margins; however, it is preferably set so as to be in the range of, for instance, from 0.05 to 0.2 µm. It is because to the general design rule (corresponding to the gate length) of 0.13 to 0.5 µm, a value of substantially 40% of the design rule can be preferably assigned as a width of the paraelectric film. Furthermore, the etching here is preferably performed in one step; however, depending on the restrictions such as the etching conditions and so on, a plurality of steps may be applied.

Figure 5A:
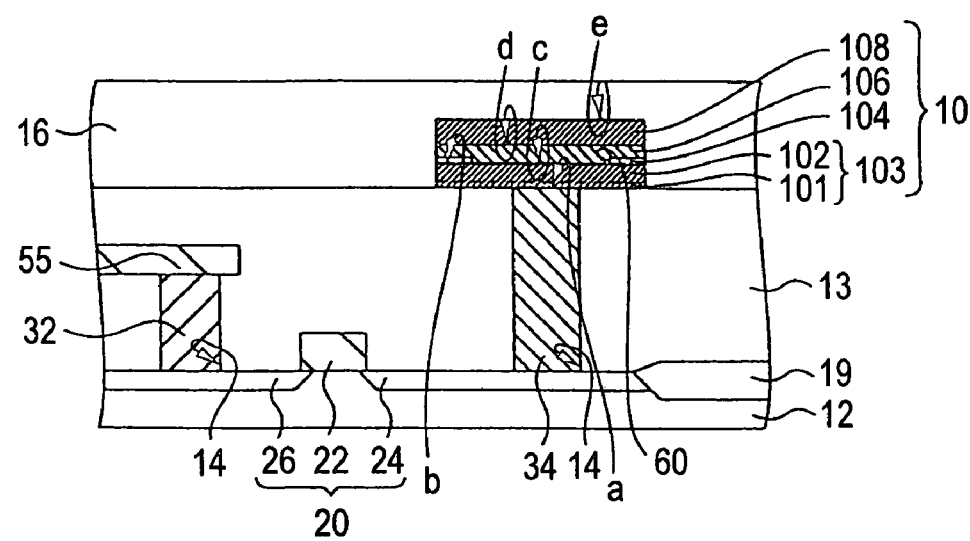
FIGS. 5A and 5B are fabrication process diagrams (part 3), subsequent to FIGS. 4A through 4C, of a semiconductor device of a first embodiment according to the invention.

After the ferroelectric capacitor 10 is formed, by means of a high density plasma CVD method, the ferroelectric capacitor 10 is buried by a silicon oxide film that is an interlayer insulating film. Thereafter, to the silicon oxide film the CMP process is applied to planarize a surface thereof, and thereby a silicon oxide 16 film having a film thickness of 800 nm is formed (FIG. 5A).

Figure 5B:
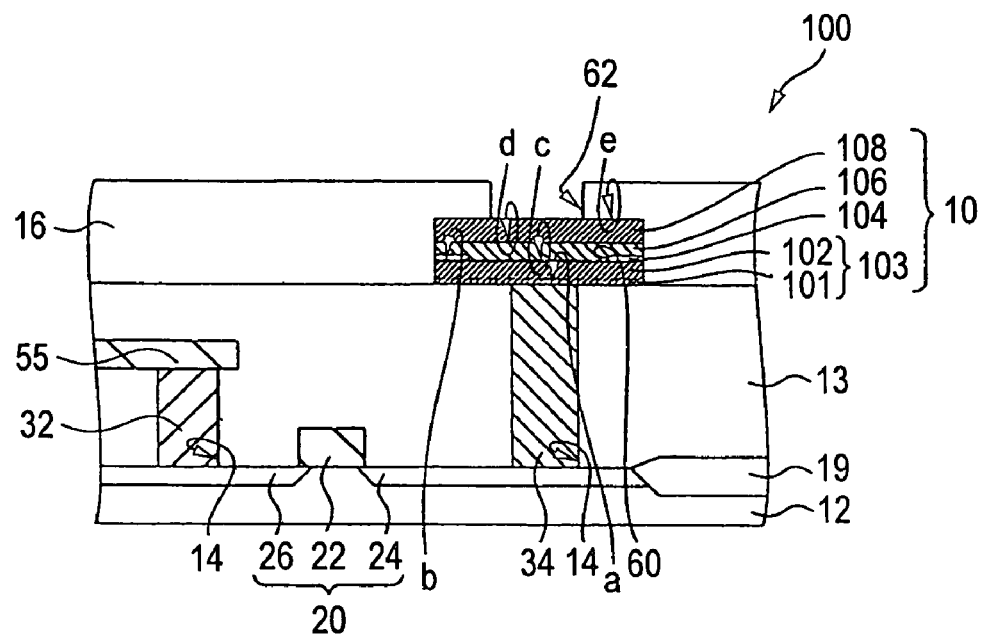

Thereafter, the photolithography and the etching are sequentially applied to the silicon oxide film 16, and thereby a contact hole 62 that reaches the upper electrode film 108 is opened (FIG. 5B). Thereafter, on the upper electrode film 108 exposed from the contact hole 62, a plate line 57 made of a platinum film is formed line-likely (FIG. 1). After the plate line 57 is formed, in order to recover the damage inflicted on the upper electrode film 108, annealing is preferably applied under a nitrogen atmosphere at 650 degree centigrade for 30 min. Furthermore, the plate line 57, in consideration of the adhesiveness with the upper electrode film 108 and the electric characteristics such as the electric resistance, is preferably formed of the same material as the upper electrode film 108.

Figure 6B:
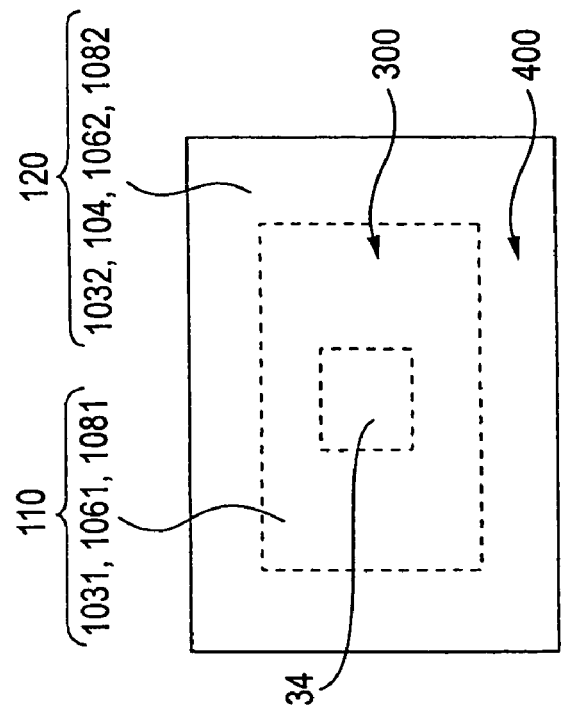
FIGS. 6A and 6B are diagrams for explaining a ferroelectric capacitor according to a first embodiment according to the invention.
Figure 6A:
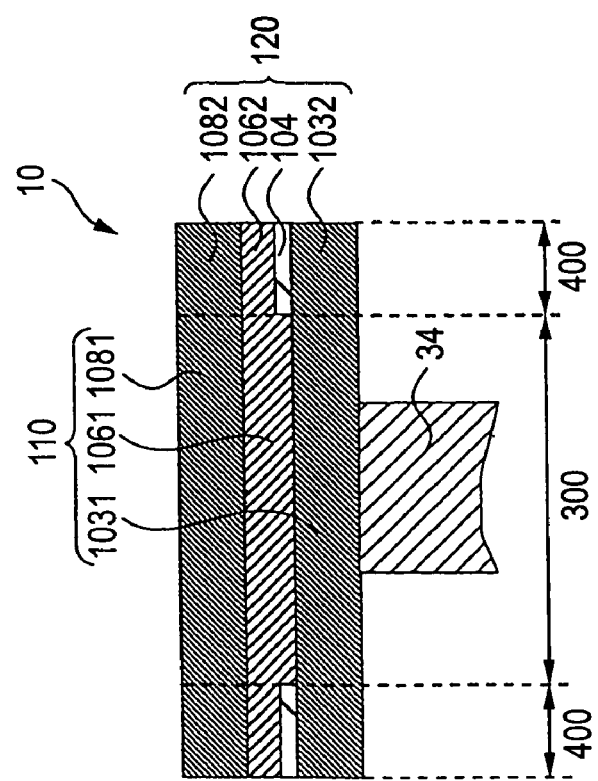

Subsequently, thus obtained ferroelectric capacitor 10 will be detailed with reference to FIGS. 6A and 6B. FIG. 6A is a schematic sectional view of an essential portion of the ferroelectric capacitor 10. FIG. 6B is a schematic diagram showing a layout of the ferroelectric capacitor 10 shown in FIG. 6A from the upward thereof.

As shown in FIGS. 6A and 6B, in an effective region 300 that effectively functions of the ferroelectric capacitor 10 obtained according to the above-mentioned fabricating method, a ferroelectric capacitor 110 that includes a portion 1031 that is in contact with the ferroelectric film 106 of the lower electrode film 103, a portion 1081 (also called as "facing region" or "squarely opposite region") that faces, that is, squarely opposes the region 1031 of the upper electrode film 108 with the ferroelectric film 106 intervened therebetween, and a portion 1061 (also called as "effective ferroelectric film") of the ferroelectric film intervened between the portion 1031 of the lower electrode film and the portion 1081 of the upper electrode film is formed.

On the other hand, of the ferroelectric capacitor 10, in a spacer region 400 that surrounds the ferroelectric capacitor 110, a capacitor (also called as "series capacitor") 120 that includes a portion 1032 that is in contact with the paraelectric film 104 of the lower electrode film 103, a portion 1082 that squarely opposes the paraelectric film 104 of the upper electrode film 108, and a ferroelectric film 1062 and the paraelectric film 104 that are intervened between the portion 1032 of the lower electrode film and the portion 1082 of the upper electrode film is formed.

That is, in the ferroelectric capacitor 10 according to the embodiment, the ferroelectric capacitor 110 formed in the effective region 300 and the capacitor 120 that is connected in parallel with the ferroelectric capacitor 110 and in which the ferroelectric capacitor and the paraelectric capacitor formed in the spacer region 400 are connected in series are equivalent.

Now, to both ends of the ferroelectric capacitor 10, that is, to the lower electrode film 103 and the upper electrode film 108, a voltage V is applied. In this constitutional example, the ferroelectric film 106 is a film of strontium bismuth tantalite (relative permittivity: substantially 200) and the paraelectric film 104 is a film of silicon oxide (relative permittivity: substantially in the range of from 3.9 to 4.9).

As a result, while an input voltage is applied on the ferroelectric capacitor in the effective region 300, a voltage applied on the ferroelectric capacitor in the spacer region 400 becomes substantially from one-fortieth to one-fiftieth of a voltage applied on the paraelectric capacitor in the spacer region 400. That is, the spacer region 400 can be substantially considered to be a ferroelectric capacitor. When a voltage applied on the ferroelectric capacitor in the spacer region 400 is substantially one-tenth of an input voltage, the spacer region 400 can be substantially considered to be a ferroelectric capacitor.

Accordingly, since the spacer region 400 can be regarded as a non-effective ferroelectric capacitor region, it is found that the effective region 300 that practically functions as the ferroelectric capacitor 10 is only the ferroelectric capacitor 110.

As obvious from the above, according to the embodiment, the damage region formed owing to the etching on the sidewall of the ferroelectric film is present in the non-effective region of the ferroelectric capacitor.

Accordingly, the ferroelectric characteristics of the ferroelectric capacitor can be inhibited from deteriorating owing to the damaged region (elimination of the problem (2)).

Furthermore, according to the embodiment, the lower electrode film, the paraelectric film, the ferroelectric film and the upper electrode film are collectively etched, and thereby the ferroelectric capacitor is formed.

Accordingly, when the ferroelectric film is formed under an oxygen atmosphere, the lower electrode film high in the oxidation resistance can be left on the silicon oxide film as a sufficient region.

As a result, in forming the ferroelectric film, oxygen can be inhibited from diffusing into the insulating film below the lower electrode film, resulting in evading the oxidation of the plug buried in the insulating film (elimination of the problem (1)).

Accordingly, since the ferroelectric capacitor higher in the reliability more than ever can be obtained, a semiconductor device high in the reliability can be realized.

<Second Embodiment>

Figure 7:
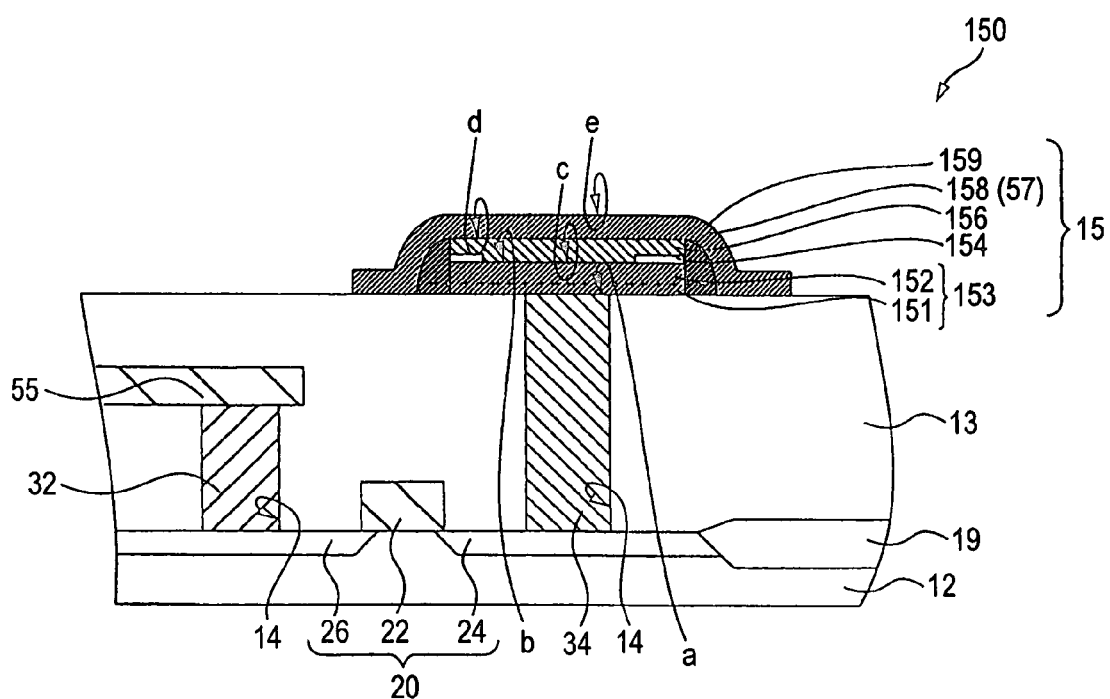
FIG. 7 is a schematic sectional view of an essential portion of a semiconductor device according to a second embodiment according to the invention.
Figure 8:
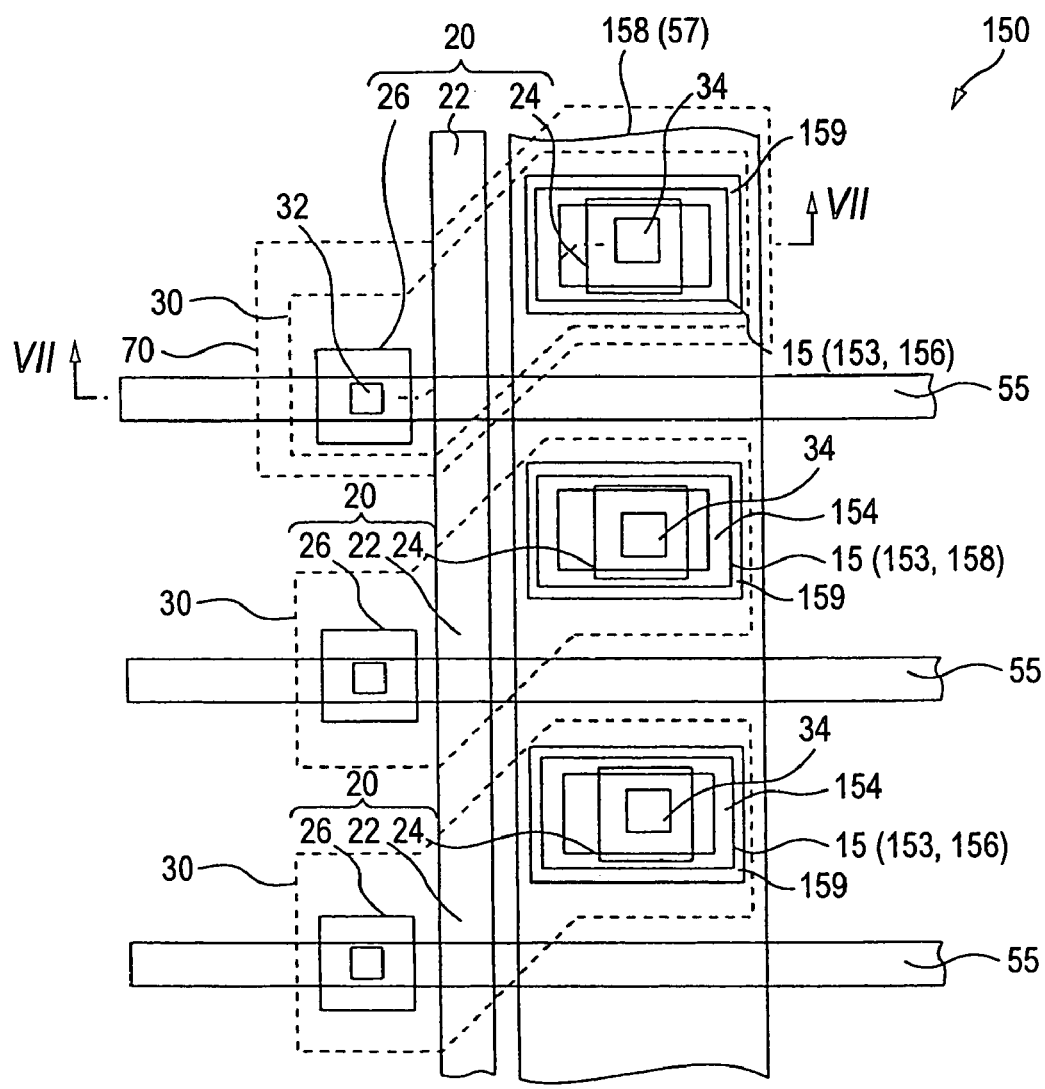
FIG. 8 is a schematic diagram showing a layout of an essential portion of a semiconductor device according to a second embodiment according to the invention.

With reference to FIGS. 7 through 9, the second embodiment of the invention will be explained.

The present embodiment is mainly different from the first embodiment in that precedent to a step of forming an upper electrode film, a lower electrode film, a paraelectric film and a ferroelectric film are etched; and the upper electrode film is disposed as the plate line. The constituent elements the same as those already explained in the first embodiment are endowed with the same reference numerals, and in some cases the explanations thereof are omitted (the same as in the following respective embodiments).

FIG. 7 is a schematic sectional view showing an essential portion of a semiconductor device 150 that is provided with a ferroelectric capacitor 15 in the present embodiment and, at the same time, a view that is obtained when seeing, from an arrow direction in the drawing, a cut face obtained by cutting a ferroelectric memory cell 70 of a schematic plan view of the semiconductor device 150 shown in FIG. 8 along a chain line VII—VII.

As shown in FIG. 8, the memory cell 70 that the semiconductor device 150 according to the embodiment has, similarly to the first embodiment, includes a transistor 20 and a ferroelectric capacitor 15. Furthermore, in the constitutional example, the ferroelectric capacitor 15 is provided with a sidewall 159 and an upper electrode film 158 simultaneously works as a plate line.

As shown in FIG. 7, the ferroelectric capacitor 15 according to the embodiment includes a lower electrode film 153 (a barrier metal 151 and an iridium film 152), a paraelectric film 154, a ferroelectric film 156, a sidewall 159 and an upper electrode film 158.

In the embodiment, on end faces of the lower electrode film 153, the paraelectric film 154 and the ferroelectric film 156, an insulative sidewall 159 is formed of a silicon oxide film. Furthermore, the upper electrode film 158 is formed over on the ferroelectric film 156 and on the sidewall 159 and combines the plate line 57.

Subsequently, with reference to FIG. 9, a method of fabricating the semiconductor device 150 will be explained.

Firstly, according to the similar method as that explained in the first embodiment, steps of from forming a transistor to forming a ferroelectric film are carried out (FIG. 4A).

Figure 9A:
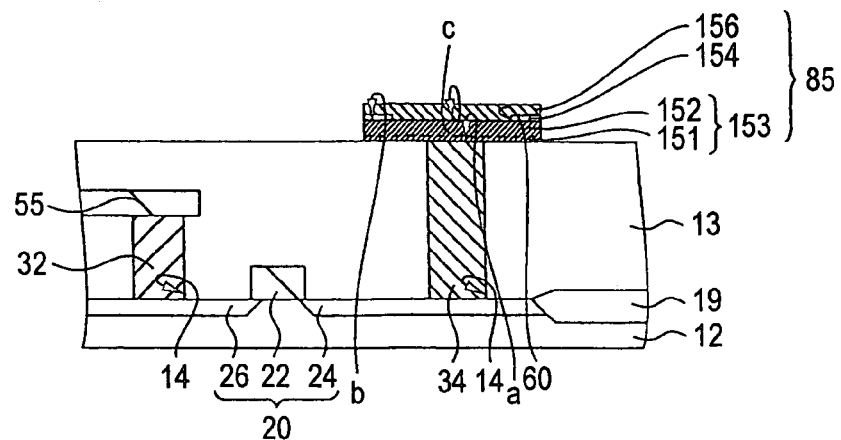
FIGS. 9A through 9C are fabrication process diagrams of a semiconductor device according to a second embodiment according to the invention.

Subsequently, as a step of etching, similarly to the first embodiment, firstly, at a surface of the ferroelectric film 156, a mask (not shown in the drawing) that is on a region that faces a contact surface c of the lower electrode film 153 and the ferroelectric film 156 and on a region that is the surroundings of the region and faces the paraelectric film 154 is formed. Thereafter, through the mask, from a side of a surface of the ferroelectric film 156, the etching is applied to the ferroelectric film 156, the paraelectric film 154 and the lower electrode film 153, and thereby a stacked body 85 in which a frame-like paraelectric film 104 is left with a predetermined width (FIG. 9A).

Subsequently, as a step of forming a sidewall, on end faces of the ferroelectric film 156, the paraelectric film 154 and the lower electrode film 153 that were formed according to the etching, an insulative sidewall is formed.

Figure 9B:
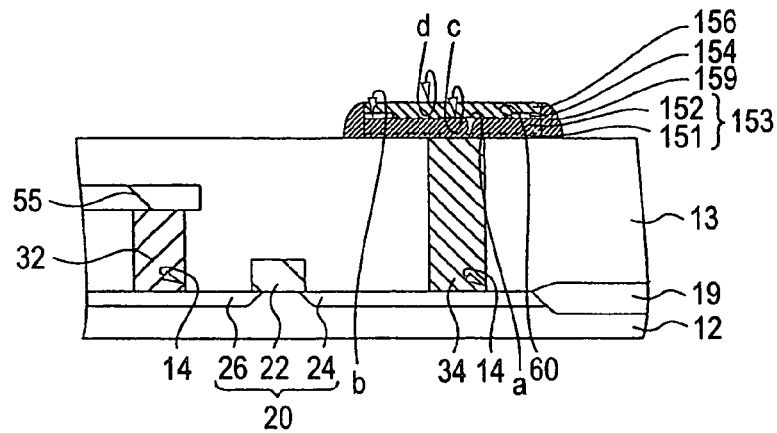

Then, after a silicon oxide film is formed on the stacked body 85 and the silicon oxide film 13 by means of the CVD method, an etch-back process is applied over an entire surface to form a sidewall 159 (FIG. 9B). Owing to the sidewall 159, in a later step of forming an upper electrode film, a conductive film for use in the formation of the upper electrode film and the lower electrode film can be inhibited from short-circuiting.

Figure 9C:
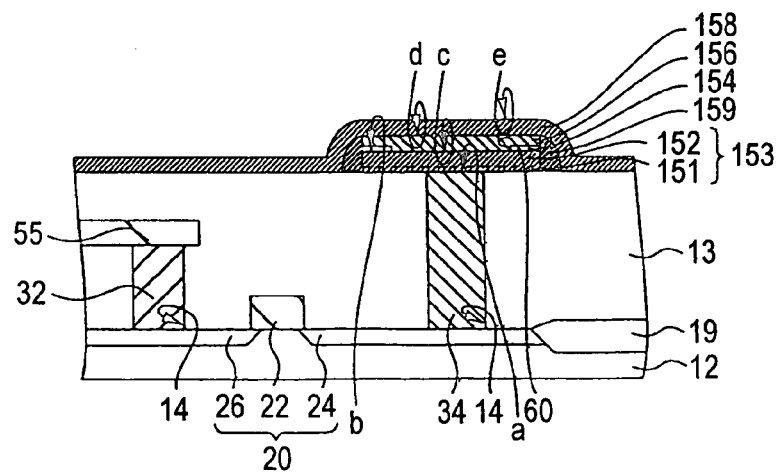

Subsequently, as a step of forming an upper electrode film, on the ferroelectric film 156 and on the sidewall 159, a platinum film that is a conductive film for use in the formation of the upper electrode film is formed, by means of the sputtering method, in a film thickness of 100 nm (FIG. 9C.) Thereafter, to the platinum film, photolithography and etching are sequentially applied, and thereby an upper electrode film 158 that combines the plate line is formed line-likely (FIG. 7).

As obvious from the above explanation, according to the embodiment, similarly to the first embodiment, problems (1) and (2) can be overcome.

Furthermore, according to the embodiment, the upper electrode film combines the plate line; accordingly, there is no need of a contact hole (FIG. 1) that electrically connects the upper electrode film and the plate line as in the first embodiment. Accordingly, the charge-up damage during the contact hole formation can be avoided, resulting in more suppressing the deterioration of the upper electrode film than the first embodiment.

<Third Embodiment>

Figure 10:
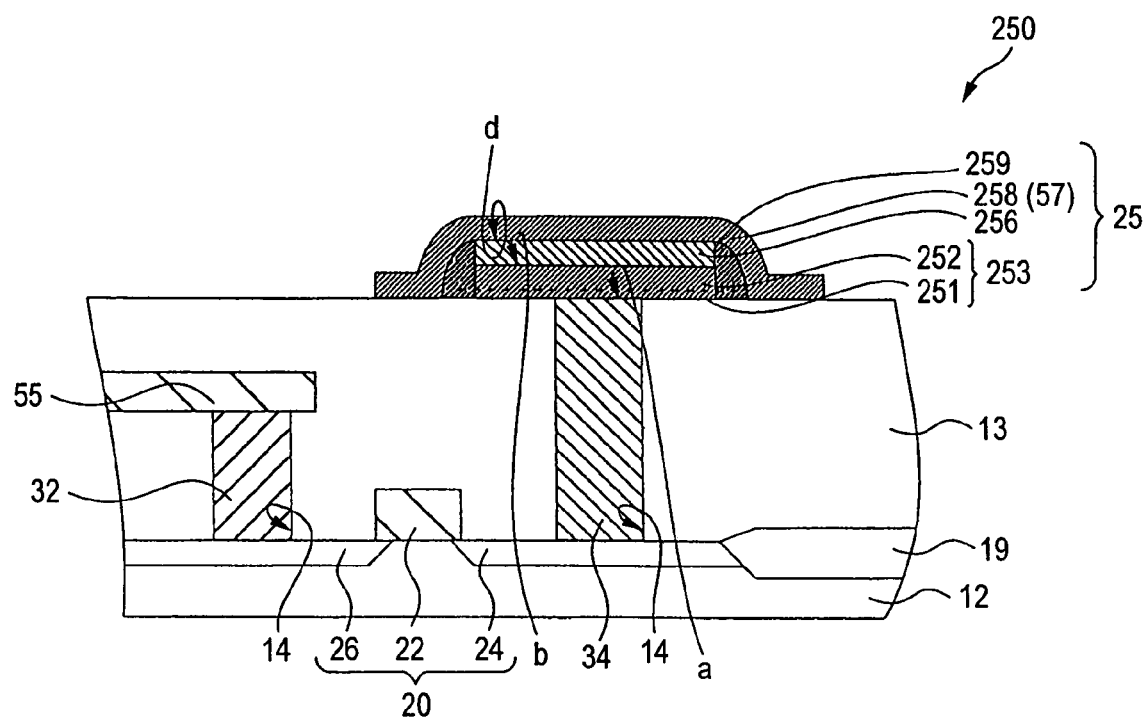
FIG. 10 is a schematic sectional view of an essential portion of a semiconductor device according to a third embodiment according to the invention.

With reference to FIGS. 10 and 11, the third embodiment according to the invention will be explained.

The present embodiment is mainly different from the second embodiment in that the step of forming a paraelectric film is not performed.

As shown in FIG. 10, a ferroelectric capacitor 25 that a semiconductor device 250 according to the embodiment is provided with includes a lower electrode film 253, a ferroelectric film 256, a sidewall 259 and an upper electrode film 258.

In the embodiment, on end faces of the lower electrode film 253 (a barrier metal 251 and an iridium film 252) and the ferroelectric film 256, an insulative sidewall 259 made of a silicon oxide film is formed. Furthermore, the upper electrode film 258 is formed on the ferroelectric film 256 and on the sidewall 259 and combines the plate line 57.

Subsequently, with reference to FIG. 11, a method of fabricating the semiconductor device 250 will be explained.

Firstly, according to a method similar to that explained above in the first embodiment, the steps from forming a transistor to forming a lower electrode film are carried out (FIG. 3A).

Figure 11A:
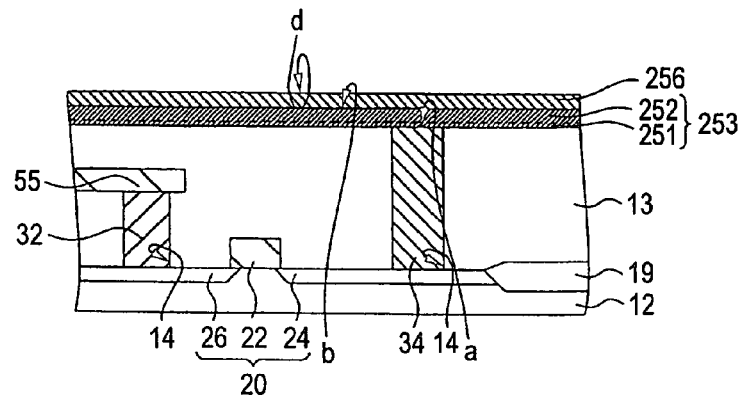
FIGS. 11A through 11C are fabrication process diagrams of a semiconductor device according to a third embodiment according to the invention.

Subsequently, in the embodiment, as a step of forming a ferroelectric film, on the lower electrode film 253, according to a method similar to that explained in the first embodiment, as a ferroelectric film having a film thickness of 100 nm, a strontium bismuth tantalite film 256 is formed (FIG. 11A).

Figure 11B:
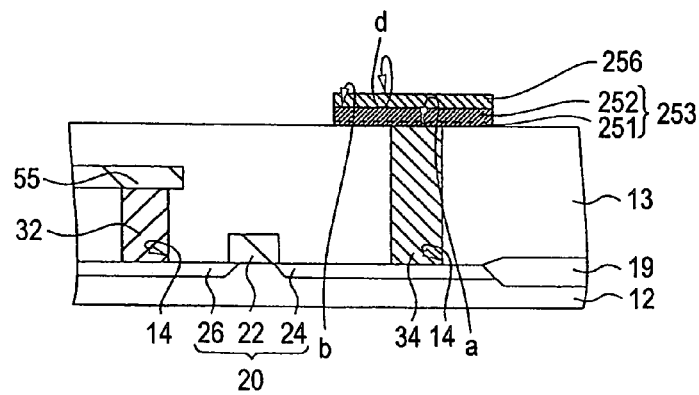

Still subsequently, as a step of etching, in a surface d of the ferroelectric film 256, a mask (not shown in the drawing) that covers a region that faces a top surface a of a plug is formed. Thereafter, through the mask, from a side of a surface of the ferroelectric film 256, the ferroelectric film 256 and the lower electrode film 253 are etched (FIG. 11B).

Figure 11C:
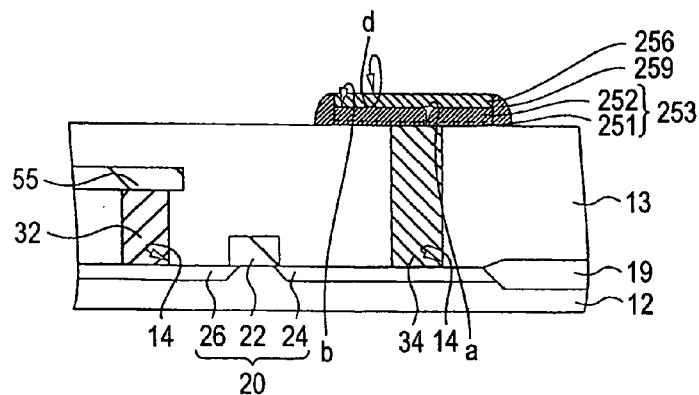

Subsequently, as a step of forming a sidewall, according to a method similar to that explained in the second embodiment, on end faces of the ferroelectric film 256 and the lower electrode film 253 that were formed by etching, a sidewall 259 made of a silicon oxide film is formed (FIG. 11C).

Still subsequently, according to a method similar to that explained in the second embodiment, on the ferroelectric film 256 and on the sidewall 259, a platinum film for use in the formation of the upper electrode film is formed, and thereafter an upper electrode film 258 that combines the plate line is formed line-likely (FIG. 10).

As obvious from the above explanation, also in this embodiment, similarly to the first embodiment, the problem (1) can be eliminated.

Furthermore, in the embodiment, in the step of etching, a damage region due to an intermediate reaction product that is formed through a reaction between an upper electrode film material and a reaction gas can be evaded from forming on the sidewall of the ferroelectric film (elimination of the problem (2)).

In the above, conditions and so on in the embodiments according to the invention are not restricted to the above combinations. Accordingly, by appropriately combining preferable conditions in an arbitrary and preferable stage, the present invention can be applied.

For instance, materials for the lower electrode film, the paraelectric film, the ferroelectric film and the upper electrode film are not restricted to the above mentioned ones alone; that is, in accordance with the object and the design, arbitrary and preferable materials can be selected. For instance, as the materials for the upper electrode film and the lower electrode film, other than iridium and platinum, oxidation resistant metals such as ruthenium (Ru) and conductive metal oxides such as iridium oxide ($IrO_2$) and ruthenium oxide ($RuO_2$) can be arbitrarily and preferably used. Furthermore, as materials for the ferroelectric film, other than strontium bismuth tantalite, lead zirconium titanate ($PbZrTiO_3$), lanthanum (La)-doped lead zirconium titanate, niobium (Nb)-doped strontium bismuth tantalite, lanthanum bismuth titanate ($LaBiTiO_3$) and so on that are materials having the relative permittivity of 100 or more can be arbitrarily and preferably used.

Furthermore, in the above respective embodiments, with a capacitor structure having a ferroelectric film as an example, explanations were given. However, in place of the ferroelectric film, paraelectric films having the relative permittivity of substantially 10 (also called as "high dielectrics") can be applied to the invention. As the high dielectrics materials, for instance, tantalum oxide ($Ta_2O_5$), zirconia ($ZrO_2$) and so on can be used.

As obvious from above explanations, according to the invention, since the sidewall of the ferroelectric film that the ferroelectric capacitor has is present outside of the effective region where the ferroelectric capacitor effectively functions, the ferroelectric characteristics can be inhibited from deteriorating owing to the damage region formed on the sidewall of the ferroelectric film.

Furthermore, according to the invention, in forming the ferroelectric film under an oxygen atmosphere, in a wide region on the semiconductor substrate, the lower electrode film high in the oxidation resistance can be allowed to remain. As a result, in forming the ferroelectric film, the plug under the lower electrode film can be inhibited from oxidizing.

Accordingly, the ferroelectric capacitor high in the reliability can be obtained and thereby the semiconductor device high in the reliability can be realized.

What is claimed is:

1. A method of fabricating a ferroelectric capacitor comprising:

forming a lower electrode film on a top surface of a conductive portion formed in a through hole disposed in an insulating layer and on the insulating layer surrounding the top surface;

forming a paraelectric film on the lower electrode film so as to partially expose a surface of the lower electrode film;

forming a ferroelectric film on the exposed lower electrode film and on the paraelectric film surrounding the exposed lower electrode film;

forming an upper electrode film, on a surface of the ferroelectric film including a first region that faces a contact surface between the lower electrode film and the ferroelectric film and a second region that surrounds the first region and faces the paraelectric film; and etching the upper electrode film, the ferroelectric film, the paraelectric film and the lower electrode film using a mask that covers a surface of the upper electrode film including over the first region and the second region.

2. The method of fabricating a ferroelectric capacitor as set forth in claim 1, wherein said forming a paraelectric film comprises forming the paraelectric film so as to cover a periphery of a surface of the lower electrode film as a frame with a predetermined width.

3. The method of fabricating a ferroelectric capacitor as set forth in claim 2, wherein said etching is carried out so that the paraelectric film remains as having a width in a range of from 0.05 to 0.2 μm.

4. The method of fabricating a ferroelectric capacitor as set forth in claim 1, wherein said forming a lower electrode film comprises:

forming a barrier metal on the top surface of the conductive portion and on the insulating layer surrounding the top surface; and forming an oxidation resistant metal film on the barrier metal.

5. The method of fabricating a ferroelectric capacitor as set forth in claim 4, wherein the barrier metal is titanium nitride and the oxidation resistant metal film is iridium.

6. The method of fabricating a ferroelectric capacitor as set forth in claim 1, wherein a relative permittivity of the ferroelectric film is substantially 200 and a relative permittivity of the paraelectric film is substantially in a range of from 3.9 to 4.9.

7. The method of fabricating a ferroelectric capacitor as set forth in claim 6, wherein the ferroelectric film is strontium bismuth tantalite and the paraelectric film is silicon oxide.

8. The method of fabricating a ferroelectric capacitor as set forth in claim 1, wherein a relative permittivity of the ferroelectric film is substantially 200 and a relative permittivity of the paraelectric film is substantially from 6 to 9.

9. The method of fabricating a ferroelectric capacitor as set forth in claim 8, wherein the ferroelectric film is strontium bismuth tantalite and the paraelectric film is silicon nitride.

10. The method of fabricating a ferroelectric capacitor as set forth in claim 1, wherein said forming a paraelectric film comprises a plasma CVD process using ozone-tetraethyl orthosilicate.

11. A method of fabricating a semiconductor device comprising:

forming a transistor that includes a control electrode disposed on a semiconductor substrate, and first and second main electrodes formed at positions that are surface regions of the semiconductor substrate and that sandwich the control electrode;

forming an insulating layer that covers the semiconductor substrate and the transistor;

forming, in the insulating layer, a through hole that reaches any one of the first main electrode or the second main electrode;

forming a conductive portion in the through hole;

forming a lower electrode film on a top surface of the conductive portion and on the insulating layer surrounding the top surface;

forming a paraelectric film on the lower electrode film so as to partially expose a surface of the lower electrode film;

forming a ferroelectric film on the exposed lower electrode film and on the paraelectric film surrounding of the exposed lower electrode film;

forming an upper electrode film, on a surface of the ferroelectric film including a first region that faces a contact surface between the lower electrode film and the ferroelectric film and a second region that surrounds the first region and that faces the paraelectric film; and etching the upper electrode film, the ferroelectric film, the paraelectric film and the lower electrode film using a mask that covers a surface of the upper electrode film including over the first region and the second region.

12. The method of fabricating a semiconductor device as set forth in claim 11, wherein said forming a paraelectric film comprises forming the paraelectric film so as to cover a periphery of a surface of the lower electrode film as a frame with a predetermined width.

13. The method of fabricating a semiconductor device as set forth in claim 12, wherein said etching is carried out so that the paraelectric film remains as having a width in a range of from 0.05 to 0.2 μm.

14. The method of fabricating a semiconductor device as set forth in claim 11, wherein said forming a lower electrode film comprises:

forming a barrier metal on the top surface of the conductive portion and on the insulating layer surrounding the top surface; and forming an oxidation resistant metal film on the barrier metal.

15. The method of fabricating a semiconductor device as set forth in claim 14, wherein the barrier metal is titanium nitride and the oxidation resistant metal film is iridium.

16. The method of fabricating a semiconductor device as set forth in claim 11, wherein a relative permittivity of the ferroelectric film is substantially 200 and a relative permittivity of the paraelectric film is substantially in a range of from 3.9 to 4.9.

17. The method of fabricating a semiconductor device as set forth in claim 16, wherein the ferroelectric film is strontium bismuth tantalite and the paraelectric film is silicon oxide.

18. The method of fabricating a semiconductor device as set forth in claim 11, wherein said forming a paraelectric film comprises a plasma CVD process using ozone-tetraethyl orthosilicate.

19. The method of fabricating a semiconductor device as set forth in claim 11, wherein a relative permittivity of the ferroelectric film is substantially 200 and a relative permittivity of the paraelectric film is substantially from 6 to 9.

20. The method of fabricating a semiconductor device as set forth in claim 19, wherein the ferroelectric film is strontium bismuth tantalite and the paraelectric film is silicon nitride.

* * * * *